US00RE36006E

United States Patent [19]

Bohannon et al.

[11] E Patent Number: Re. 36,006

[45] Reissued Date of Patent: Dec. 22, 1998

[54] METAL SELECTIVE POLYMER REMOVAL

[75] Inventors: Brynne K. Bohannon, Sachse, Tex.; Daniel J. Syverson, Chaska, Minn.

[73] Assignee: FSI International, Inc., Chaska, Minn.

[21] Appl. No.: 739,885

[22] Filed: Oct. 31, 1996

Related U.S. Patent Documents

Reissue of:

[64] Patent No.: 5,348,619
Issued: Sep. 20, 1994
Appl. No.: 940,101
Filed: Sep. 3, 1992

[51] Int. Cl.[6] ..... H01L 21/302

[52] U.S. Cl. ..... 438/734; 438/704; 438/735; 134/1.3

[58] Field of Search ..... 156/345, 646.1, 156/652.1, 653.1, 662.1; 438/704, 734, 735; 134/1.3

[56] References Cited

U.S. PATENT DOCUMENTS

| | | | |
|---|---|---|---|
| 4,566,935 | 1/1986 | Hornbeck | 156/626 |
| 4,711,017 | 12/1987 | Lammert | 437/20 |
| 4,749,440 | 6/1988 | Blackwood et al. | 156/646 |
| 5,030,319 | 7/1991 | Nishino et al. | 156/635 |
| 5,041,362 | 8/1991 | Douglas | 430/313 |
| 5,055,383 | 10/1991 | Koblinger et al. | 430/312 |
| 5,089,084 | 2/1992 | Chhabra et al. | 156/646 |
| 5,181,985 | 1/1993 | Lampert et al. | 156/635 |
| 5,200,361 | 4/1993 | Omishi | 437/194 |
| 5,201,992 | 4/1993 | Marcus et al. | 156/643 |

FOREIGN PATENT DOCUMENTS

| | | |
|---|---|---|
| 0 227 561 | 11/1986 | European Pat. Off. . |
| 0 413 040 A1 | 2/1991 | European Pat. Off. . |
| 59-166675 | 9/1984 | Japan . |
| 4-22123 | 1/1992 | Japan . |
| 4360530 | 12/1992 | Japan . |
| 87/01508 | 3/1987 | WIPO . |
| 91/17897 | 11/1991 | WIPO . |

OTHER PUBLICATIONS

Form 1449 Patent No. 5,348,619.

An Investigation of the 200mm $SiO_2$ Etching Capability of the EXCALIBUR™, FSI Technical Report TR 336, Jul. 17, 1989.

Membrane Diffuser Characterization for EXCALIBUR™, FSI Technical Report TR 349, Jul. 10, 1989.

Process Chamber Upgrade for the EXCALIBUR™ System, FSI Technical Report, TR 351, Jun. 11, 1990.

ULSI Processing Equipment EXCALIBUR™ ISR 200, FSI Technical Report, TR 365, Mar. 1, 1991.

EXCALIBUR™ Gas Processing System: An Overview of Process and Equipment, FSI Technical Report TR 315, Sep. 18, 1987.

Form 1449 Serial No. 08/940,101, dated (Nov. 1993).

Dr. C. Rinn Cleavelin, Texas Instruments Inc., Lubbock, Texas, and Gary T. Duranko, FSI International Inc., Chaska, Minn., "Silicon Dioxide Removal in Anhydrous HF Gas", Semiconductor International, vol. 10, No. 12, Nov. 1987, pp. 94–99.

Richard E. Novak, FSI International, Inc., "Anhydrous HF Etching of Native $SiO_2$: Applications to Device Fabrication", Solid State Technology, vol. 13, No. 3, Mar. 1988, pp. 39–41.

D. N. Nichols, A. M. Goethals, P. De Geyter and L. Van den hove, Implementation of Desire in a 0.5 μm NMOS Process, 8226 Microelectronic Engineering, 11 (1990) Apr., Nos. 1/4, pp. 515–520.

*Primary Examiner*—R. Bruce Breneman
*Assistant Examiner*—George Goudreau
*Attorney, Agent, or Firm*—Vidas, Arrett & Steinkraus, P.A.

[57] ABSTRACT

A metal selective polymer removal process is disclosed which prevents metal lift-off for use especially suited for ULSI fabrication.

19 Claims, 3 Drawing Sheets

METAL SELECTIVE POLYMER REMOVAL

Matter enclosed in heavy brackets [ ] appears in the original patent but forms no part of this reissue specification; matter printed in italics indicates the additions made by reissue.

BACKGROUND OF THE INVENTION

The density of devices fabricated on semiconductor substrates has increased steadily over the years with ultra large scale integration (ULSI) currently being employed in 16 megabit (MB) dynamic random access memories (DRAMs). Accompanying this trend have been decreased feature sizes (currently less than or equal to 0.5 microns) and increased demands on process technology. To pattern such small features, conventional lithographic procedures are being supplanted by newer ones based on diffusion enhanced silylated resist DESIRE™ processes. The numerous reports of the success of the diffusion enhanced silylated processes in producing sub-half micron features in various resists, using one line and deep ultra violet light exposure indicates this process has a bright future. The resolution and throughput rate up to the image transfer step exceeds that of conventional positive resists and are clearly superior when topography is of major concern. The resist is somewhat more difficult to remove with diffusion enhanced silylated resist processes as compared with conventional processes as a result of larger amounts of etch byproducts such as sidewall polymer (SWP) on vertical walls of a device undergoing fabrication. These byproducts, generally referred to as polymers, are generally comprised of a metal and $SiO_2$ molecule. For instance, the molecule can comprise carbon from the photoresist, metal from the metal layer and $SiO_2$. Further, data has indicated that sidewall polymer is comprised of aluminum silicate and very small amounts of fluorocarbons. Fluorocarbons are noncombustible and therefore are not removed during an $O_2$ in-situ ash sequence of a metal etch. Thus, ashing has proven to be ineffective because of the high carbon content in the byproduct molecule from the photoresist. The difficulty with which resist can be removed has proven to be a severe impediment to the generation of sub-half micron features. Previously solvent/ultrasonic agitation had been used to remove SWP. For instance, soaking the device undergoing fabrication in an ethanolamine solution followed optionally with ultrasonic agitation using a Ney ultrasonic (which allows the capability of adjusting the power of the ultrasonic) has been used in the past. However, these techniques prove to be unusable because of the tendency of metal, such as aluminum, to lift off of the minimum features. Further, these techniques tend to leave behind significant amounts of residue on device sidewalls and on device surfaces. Until now, no effective means has been available to solve the problem of removing sidewall polymer resulting from diffusion enhanced silyated resist processes.

SUMMARY OF THE INVENTION

A process to remove the sidewall polymer without metal lift-off is disclosed.

DETAILED DESCRIPTION OF THE INVENTION

Figure 1:
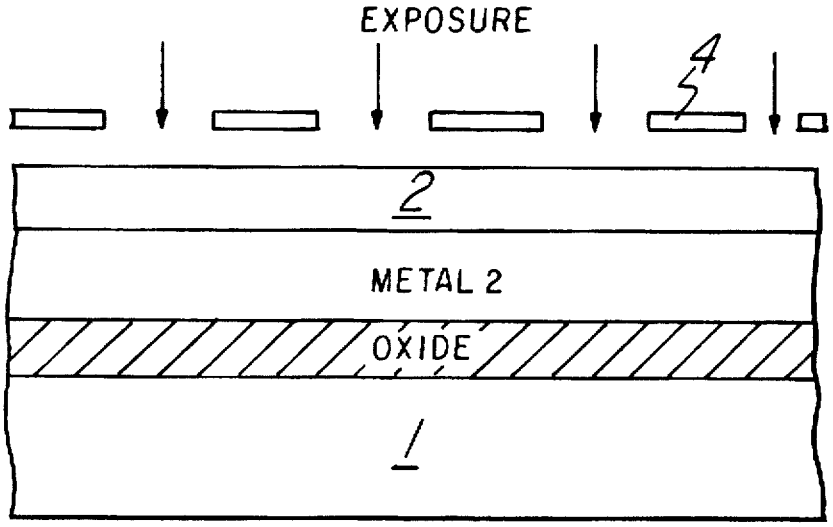
FIGS. 1 through 6 are drawings in which applicable reference numerals have been carried forward, which illustrate cross-sectional views of a semiconductor wafer undergoing fabrication according to a diffusion enhanced silyated resist process.
Figure 2:
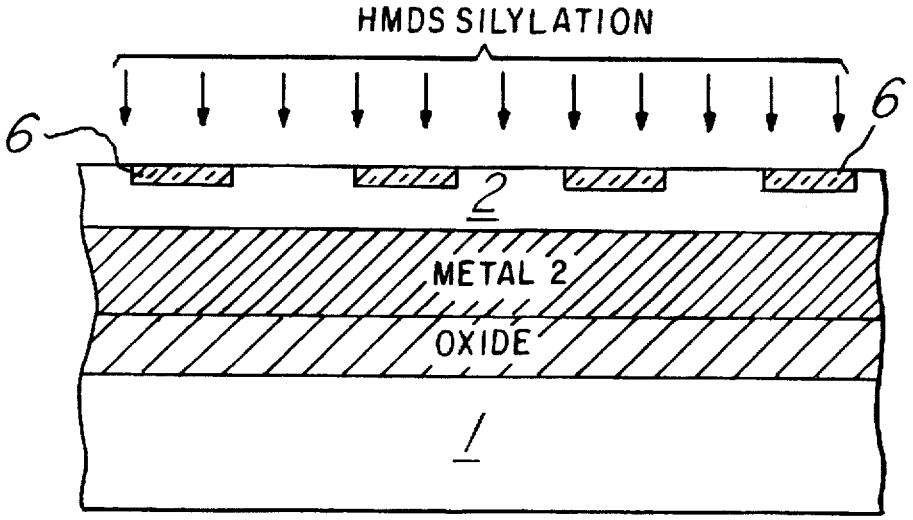
Figure 3:
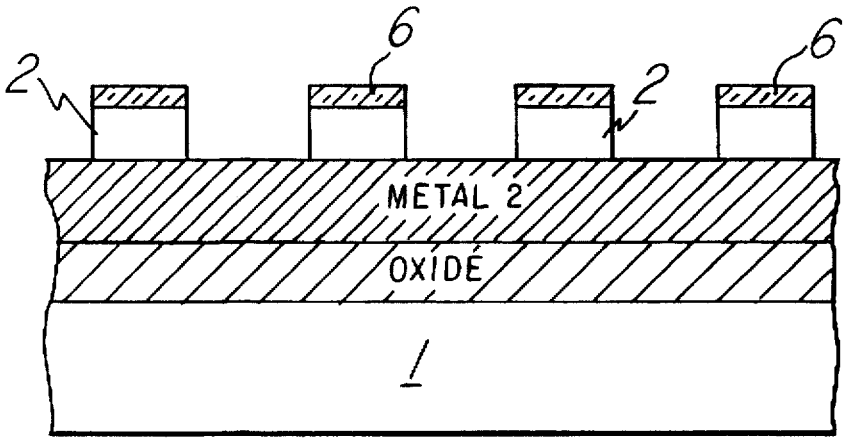
Figure 4:
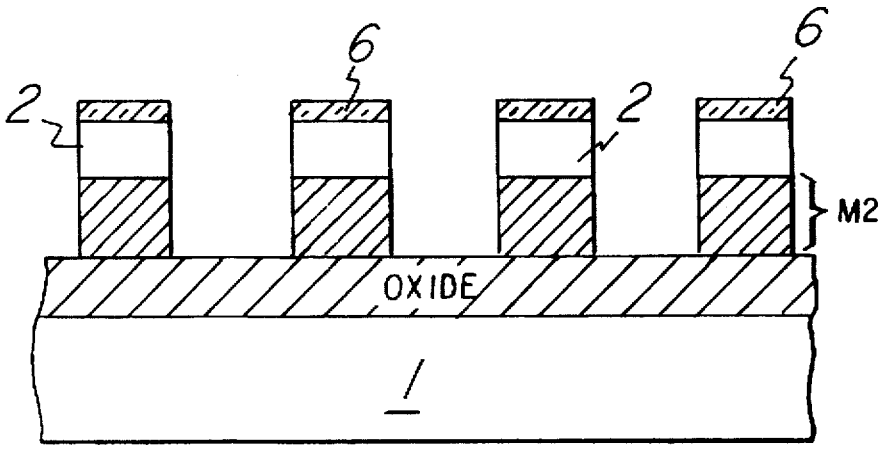
Figure 5:
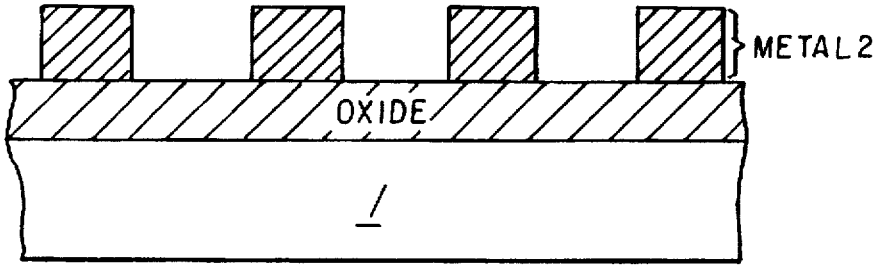

Late in the fabrication sequence, specific devices such as DRAMs must be electrically interconnected to accomplish the desired circuit function. One important aspect of this interconnection concerns the second interconnect level and the last level in the manufacture of the device, conventionally known as Metal 2 (M2). The M2 scheme as shown in the cross-sectional FIG. 1, conventionally comprises a Si $O_2$ substrate followed by metal 2 which generally comprises a layer of titanium tungsten (TiW) under tungsten (W) which lies under aluminum alloy which includes 1% silicon and 0.5% copper. With reference to FIGS. 1 through 6 which illustrate cross-sectional views of a semiconductor wafer 1 undergoing fabrication according to a diffusion enhanced silylated resist process, that process is as follows. A positive resist such as a novolac-based resist 2 is conventionally spin-coated and after subsequent exposure through mask 4, resist 2 is treated with hexamethyldisilazine vapor (HMDS) prior to development. The silyation reaction modifies the surface of the exposed resist, yielding areas 6 which are less susceptible to dry etching by $O_2$ plasmas. This reverses the normal development behavior of the resist and affords a negative image. A main advantage of dry etching the unexposed (and hence underivatized) resist is that it circumvents the undesirable swelling and the concomitant loss of resolution that often accompanies wet etch development. As shown in FIG. 3, an oxygen plasma etch etches away the unexposed resist. In order to transfer the pattern into the metal, the wafer is dry etched with an anisotropic reactive ion etching (RIE). The chemistries used are $Cl_2/BCl_3$ to etch the aluminum alloy followed by $SF_6$/Ar to etch the W and TiW. Fine line geometries with essentially vertical walls are ideally obtained as shown in FIG. 4. The final step in the etch is an in situ ash which reduces corrosion by oxidizing the responsible chlorine-containing compounds and removes areas 6 which function as bulk resist masks. This etch is greater than 20:1 selective to the $SiO_2$ substrate. The etch is anisotropic because during the process a nonvolatile polymer (SWP) is deposited on the surfaces being etched which protects the underlying surfaces against etching by reactive gas. Stripping of remaining resist and SWP is the last step in the process flow for this level. The invention's process is a vapor phase process which involves anhydrous HF and $N_2H_x$ where x is a real number ($N_2H_x$ is achievable by passing nitrogen over water), introduced in a chamber with the wafer to be processed, which react to make the etch byproducts 5 water soluble. After the byproducts acquire their water soluble property, water is applied to the wafer so as to rinse the byproduct away, as shown in FIG. 5. Note that aqueous HF can be substituted for anhydrous HF- i.e. one can make vapor HF from aqueous HF and react it with the aforementioned $N_2$+$H_2O$. Vapor phase processing provides an advantage or other types of processing in that it will not corrode metal like aqueous phase or liquid phase processing. Experimental data indicates that after processing according to the invention, the sheet resistance on the metal does not change, thereby indicating the reactions during processing do not harm metal. Further, damage resulting from processing to the silicon dioxide substrate can be controlled through the regulation of vapor. The process of the invention can be accomplished using a wafer vapor phase cleaner. A wafer vapor phase cleaner is a machine that removes oxides from a wafer. Wafer vapor phase cleaners include the Advantage, Equinox and [Excaliber] *Excalibur®* machines and a vapor HF tool, VPC-811-A by DNS. Until now, no one has used a wafer vapor phase cleaner to remove byproducts of the type discussed above. Cost savings from the invention's process is expected at this time to be approximately 0.03 cents per wafer as compared with current solvent processing methods which incur costs of around $1.50 per wafer. Additionally, there is a safety advantage associated with the invention in that there is virtually no waste disposal as compared with solvents which incidently cannot be diluted.

An exemplary process flow is illustrative of the preferred embodiment of the invention is given below:

In a wafer vapor phase cleaner, such as an [Excaliber,] *Excalibur®* wafers that have been processed according to diffusion enhanced silylated resist processes are etched in a sealed etch chamber and then transported to the rinse position by moving the chamber vertically to expose the rinse cavity of the wafer vapor phase cleaner. The two separate process' for the etch and the rinse positions are as follows:

| | |
|---|---|
| | Etch position |
| Step 0 | After inserting the wafer into the chamber, the chamber is purged for 5 seconds with nitrogen at 30 liters/minutes (lpm) |
| Step 1 | The process nitrogen flow rate is stabilized for 5 seconds at 12 lpm and the chamber pressure is controlled to 26 inches of water column (TWC). |
| Step 2 | The water laden nitrogen is added at a flow rate of 2 lpm for 10 seconds. [This will allow a thin layer of water to condense on the surface of the wafer.] |
| Step 3 | Anhydrous HF is added to the other gases at a flow ratea of 180 cc/minute. The nitrogen flow rates are changed to 16 lpm and 10 lpm for the carrier gas and the water vapor respectively. Total etch time is 5 seconds. Oxides are removed dudring the step leaving non-volatile material on the surface. |
| Step 4 | For 15 seconds the chamber is purged with high velocity nitrogen (12 lpm) and water vapor (10 lpm) to stop the reaction from occuring and to purge reactants for the chamber. |
| Step 5,6 | Transition steps form etch to rinse position. |
| | Rinse Position |
| Step 0 | One second to stabilize the position. |
| Step 1 | Wafer receives a 10 second deionized water rinse at a spin speed of 100 rpm. Water soluble metal fluorides are removed in this step. |
| Step 2 | Discontinue water rinse and allow water on wafer to be removed before ramping up to dry spin speed. Process time is about one minute. |
| Step 3 | Ramp to 3000 rpm to dry wafer and increase nitrogen gas flow to 30 lpm. The wafer is dried in 15 seconds. |

One example of a process program using an [Excaliber] *Excalibur®* system is given below. Note that the etch and rinse recipes are exemplary only and that a more or less optimized process recipe may not use the same recipes.

Excalibur Process

| Step # | Time Sec | $N_2A$ lpm | Vapor lpm | HF-1 sccm | HF-2 sccm | $N_2B$ lpm | VSB 0/1 | $H_2O$ 0/1 | T.T. RPM |
|---|---|---|---|---|---|---|---|---|---|
| | | | | Etch Process | | | | | |
| 0 | 5 | 30.0 | | | | 1.0 | 0 | 0 | 20 |
| 1 | 5 | 12.0 | | | | 1.0 | 0 | 0 | 20 |
| 2 | 10 | 12.0 | 2.0 | | | 1.0 | 0 | 0 | 20 |
| 3 | 5 | 16.0 | 10.0 | 180 | 0 | 1.0 | 0 | 0 | 20 |
| 4 | 15 | 22.0 | 2.0 | | | 1.0 | 0 | 0 | 20 |
| 5 | 1 | 6.0 | | | | 1.0 | 0 | 0 | 20 |
| 6 | 1 | 6.0 | | | | 1.0 | 0 | 0 | 20 |

-continued

Excalibur Process

| Step # | Time Sec | $N_2A$ lpm | Vapor lpm | HF-1 sccm | HF-2 sccm | $N_2B$ lpm | VSB 0/1 | $H_2O$ 0/1 | T.T. RPM |
|---|---|---|---|---|---|---|---|---|---|
| | | | | Rinse Position | | | | | |
| R0 | 1 | 6.0 | | | | 1.0 | 0 | 0 | 20 |
| R1 | 10 | 6.0 | | | | 1.0 | 0 | 0 | 1000 |
| R2 | 1 | 6.0 | | | | 1.0 | 0 | 0 | 1000 |
| R3 | 15 | 30.0 | | | | 1.0 | 0 | 0 | 3000 |
| | | | | Etch Position | | | | | |
| 7 | 1 | 30.0 | | | | 2.0 | 0 | 0 | 20 |

Figure 6:
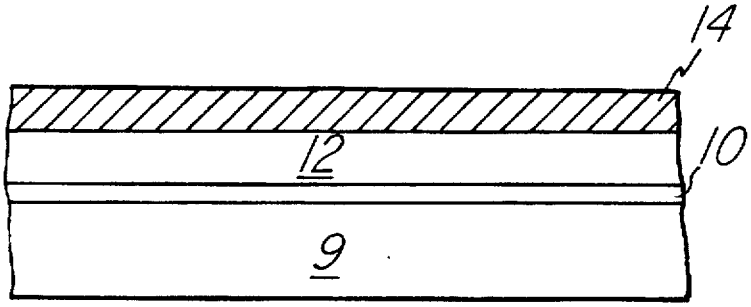
Figure 7:
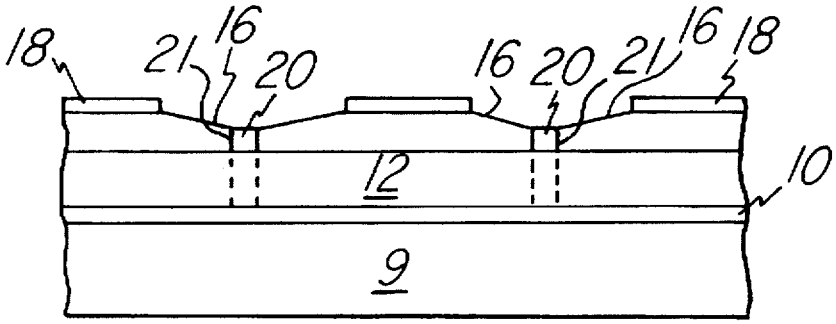
Figure 8:
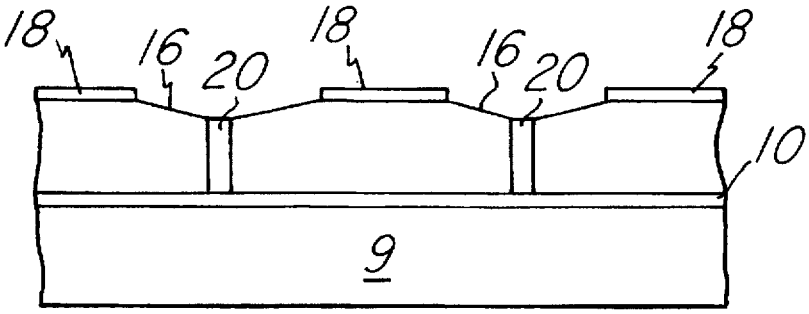

One application with which the foregoing described process can be used concerns deformable mirror devices (DMDs). FIG. 6 illustrates a cross-sectional drawing of stack 8 upon which the DMD is formed. This stack comprises bulk semiconductor layer 9, CMOS addressing circuitry 10, photoresist layer 12, and metal layer 14. With reference to FIG. 7 which illustrates a cross-sectional view of a partially formed DMD device, etching of metal layer 14, shown in FIG. 6, according to well known DMD formation techniques results in the formation of hinges 16 connected to mirrors 18. Hinges 16 are connected to metal posts 20 which are formed through vias which extend down to the level of the CMOS addressing circuitry 10 (as shown by the hidden lines). Reference numerals 21 represent sidewall polymer which results during the fabrication of the DMD device. An even greater presence of sidewall polymer 21 can exist after etch away of photoresist layer 12. The sidewall polymer presents particularly annoying problems for DMD functionality in that it can interfere with the swiveling (into or out of the page) of mirrors 18 so that they can make contact with CMOS addressing circuitry 10 after layer 12 is removed. With reference to FIG. 8, which illustrates a cross-sectional view of a completed DMD device according to the invention's process, after layer 12 of FIG. 7 is removed, the invention's sidewall polymer removal process is used to eliminate sidewall polymer 21, thereby greatly increasing the production yield of the DMD device.

Although the invention has been described in detail herein with reference to its preferred embodiment and certain described alternatives, it is to be understood that this description is by way of example only, and it is not to be construed in a limiting sense. Although the invention has been described in some aspects as referring to a DESIRE™ process, it is to be understood that the foregoing invention can be used with any photoresist process. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true [scop] *scope* of the invention as claimed below.

We claim:

1. A process for removal of [metal etch] byproducts *from a metal etch* from a semiconductor wafer comprising the following steps:

introducing HF into a chamber containing said wafer which includes non-water soluble byproducts thereon;

introducing $N_2+xH_2O$, where x is a real number, into said chamber; and removing soluble byproducts from said wafer after performing the above steps.

2. A process as recited in claim 1 where HF is anhydrous.

3. A process for removing post etch metal silicate-containing residue from a metal structure comprising the following steps:

introducing vapor HF into a chamber containing said metal structure which includes non water soluble residue thereon;

passing a gas over water and introducing the result into said chamber; and removing said post etch metal silicate-containing residue from said structure after performing the above steps.

4. A process as recited in claim 1 wherein said HF is vapor HF made [form] *from* aqueous HF.

5. A process as recited in claim 1 which is performed within a wafer [vapos] *vapor* phase cleaner.

6. A process for removing sidewall polymer from the posts of a deformable mirror device comprising the following steps:

introducing HF into a chamber containing said device which includes non-water soluble byproducts thereon, introducing $N_2+xH_2O$, where x is a real number, into said chamber; and removing soluble byproduct from said device after performing the above steps.

7. A process as recited in claim 6 which is performed within a vapor phase cleaner.

8. A process for removing post etch residue from a metal structure comprising the following steps:

introducing anhydrous HF into a chamber containing said metal structure which includes non water soluble residue thereon;

introducing water vapor into said chamber; and removing said post *etch* residue from said structure after performing the above steps.

9. A process as recited in claim 8 wherein the removal of said post etch residue includes rinsing said structure with water.

10. A process for removing post etch residue from a metal structure comprising the following steps:

introducing anhydrous HF into a chamber containing said metal structure which includes non water soluble residue thereon;

passing a gas over water and introducing the result into said chamber; and removing said post etch residue from said structure after performing the above steps.

11. A process as recited in claim 10 wherein the removal of said post etch residue includes rinsing said structure with water.

12. A process as recited in claim 10 wherein said gas is nitrogen.

13. A process as recited in claim 3 wherein said gas is nitrogen.

14. A process as recited in claim 3 wherein the removal of said post etch residue includes rinsing said structure with water.

*15. The process of claim 1 wherein the removing of the soluble byproducts includes rinsing the wafer with water.*

*16. The process of claim 1 whereby the introducing HF and $N_2+xH_2O$ further comprises chemically reacting the non-soluble byproducts so as to form water soluble byproducts.*

*17. The process of claim 1 wherein the byproducts comprise carbon and metal.*

*18. The process of claim 8 whereby the introducing the anhydrous HF step and the introducing water vapor step further comprises chemically reacting the non-soluble residue so as to form water soluble residue prior to removing the residue.*

*19. The process of claim 10 whereby the introducing the anhydrous HF step and the introducing water vapor step further further comprises chemically reacting the non-soluble residue so as to form water soluble residue prior to removing the residue.*

* * * * *